(12) United States Patent
Shakuda et al.

(10) Patent No.: US 6,426,518 B1
(45) Date of Patent: Jul. 30, 2002

(54) SEMICONDUCTOR LIGHT EMITTING DEVICE

(75) Inventors: Yukio Shakuda; Yukio Matsumoto; Shunji Nakata, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/477,830

(22) Filed: Jan. 5, 2000

(30) Foreign Application Priority Data

Jan. 5, 1999 (JP) .......................................... 11-000714

(51) Int. Cl.$^7$ .......................... H01L 27/15; H01L 33/00
(52) U.S. Cl. .............................. 257/79; 275/79; 275/99; 275/103; 438/22
(58) Field of Search ............................ 257/79, 99, 103; 438/32

(56) References Cited

U.S. PATENT DOCUMENTS

| | | | |
|---|---|---|---|
| 5,639,674 A | * 6/1997 | Nozaki et al. | 437/5 |
| 5,792,698 A | * 8/1998 | Nishitani | 438/287 |
| 5,811,839 A | * 9/1998 | Shimoyama et al. | 257/94 |
| 5,814,838 A | * 9/1998 | Ohtsuka et al. | 257/94 |
| 5,981,976 A | * 11/1999 | Murasato | 257/94 |

FOREIGN PATENT DOCUMENTS

| | | | |
|---|---|---|---|
| JP | 408046239 A | * 2/1996 | |
| JP | 409307140 A | * 11/1997 | |

\* cited by examiner

*Primary Examiner*—Eddie Lee
*Assistant Examiner*—Joseph Nguyen
(74) *Attorney, Agent, or Firm*—Arent Fox Kintner Plotkin & Kahn PLLC

(57) ABSTRACT

A light emitting layer forming portion (9) comprising InGaAlP based compound semiconductor and forming a light emitting layer is deposited on an n-type GaAs substrate (1), a p-type current dispersion layer (5) comprising AlGaAs based compound semiconductor is provided on a surface of the light emitting layer forming portion (9), a p-side electrode (7) is provided on a portion of a surface of the current dispersion layer (5) through a contact layer (6) comprising p-type GaAs, and an n-side electrode (8) is provided on a back. surface of the GaAs substrate (1). Vickers' hardness of the current dispersion layer (5) comprising AlGaAs is 700 or higher. As a result, at the time of handling for mounting, or wire bonding, a fracture or a crack is not generated in the LED chip, and it is possible to enhance the yield of assembling steps.

9 Claims, 2 Drawing Sheets

SEMICONDUCTOR LIGHT EMITTING DEVICE

FIELD OF THE INVENTION

The present invention relates to a visible radiation semiconductor light emitting device using InGaAlP based compound semiconductor material and used in a display panel or an LED panel. More specifically, the invention relates to a semiconductor light emitting device capable of reducing mechanical deficiencies such as a fracture or a crack of a light emitting chip at the time of handling such as assembling of the semiconductor light emitting chip into a lamp.

BACKGROUND OF THE INVENTION

As shown in FIG. 4, a conventional visible radiation lamp-type semiconductor light emitting device is formed such that a semiconductor light emitting chip (LED chip, hereinafter) 20 is mounted in a recess in a tip end of one lead 31, a wire bonding is established with the other lead 32 by a metal wire 33 so that both electrodes 27 and 28 of the LED chip-20 are electrically connected to the two leads 31 and 32, the connected portions are coated with transparent epoxy resin, and thereby a package 35 is provided.

This LED chip 20 is formed in the following manner. That is, a light emitting layer forming portion 29 having a double hetero junction structure in which an active layer made of non-doped InGaAlP based semiconductor material is sandwiched between an n-type clad layer and a p-type clad layer both made of InGaAlP based semiconductor material. The active layer has such a composition that a band gap energy thereof is smaller than those of the clad layers. A p-type current dispersion layer. 25 comprising AlGaAs is sequentially formed on a surface of the light emitting layer portion 29 by epitaxial growth. A p-side electrode 27 is provided on a surface of the current dispersion layer 25 by means of Au—Ge—Ni alloy or the like through a contact layer 26 made of p-type GaAs, an n-side electrode 28 is provided on a back surface of a semiconductor substrate 21 by means of Au—Ge—Ni alloy or the like, and a wafer is divided into chips.

Conventionally, this kind of semiconductor light emitting device requires, working to divide a semiconductor wafer into chips to mount each chip 20 on a tip end of the lead 31, and to connect between the upper p-side electrode 27 and the second lead 32 by wire bonding. Therefore, at the time of chipping and handling for mounting the chip, or at the time of wire bonding, a force is partially applied to the LED chip 20, and a fracture or a crack is generated occasionally Since this LED chip itself is as small as 0.3 mm×0.3 mm, if a fracture or a crack is generated even partially, there is a problem that brightness is largely lowered and the chip becomes faulty.

The same problem is caused not only when an LED chip is bonded to a tip end of a lead to produce a lamp-type light emitting device, but also when an LED chip is directly bonded on a substrate, and when an LED chip is die bonded on an insulated substrate and is coated with resin flatly to form a chip-type light emitting device.

SUMMARY OF THE INVENTION

The present invention has been accomplished to solve the above problems, and it is an object of the invention to provide a semiconductor light emitting device capable of enhancing yield of assembling procedure without causing a fracture or a crack in an LED chip at the time of handling for mounting or wire bonding.

In order to reduce a possibility of causing a fracture or a crack in an LED chip at the time of handling for mounting or wire bonding, the present inventors earnestly studied and as a result, it was found that by allowing an AlGaAs layer which is the uppermost semiconductor layer exposing at a surface of the chip to grow at a high temperature, e.g., about 720° C., its hardness is largely increased, and by increasing the hardness of the outermost semiconductor layer, it is possible to largely reduce a possibility of causing a fracture or a crack in the chip at the time of handling.

A semiconductor light emitting device of the present invention comprises a semiconductor substrate, a semiconductor lamination portion having a light emitting layer forming portion made of InGaAlP based compound semiconductor and a current dispersion layer made of AlGaAs based compound semiconductor, and two electrodes, one of them being provided on a portion of a surface of the semiconductor lamination layer portion and the other one being provided at the. side of a back surface of the semiconductor substrate, wherein Vickers' hardness of a semiconductor layer exposed on at least the outermost surface of the semiconductor lamination portion is 700 or higher.

Here, InGaAlP based compound semiconductor is represented in a form of $In_{0.49}(Ga_{1-x}Al_x)_{0.051}P$, and the value of x is variously changed between 0 and 1. Meanwhile, 0.49 and 0.51 which are mixed crystal ratio of In and $(Al,Ga_{1-x})$ mean ratio of lattice alignment with a semiconductor substrate such as GaAs on which InGaAlP based material is laminated. AlGaAs based compound semiconductor means a compound semiconductor whose mixed crystal ratio between Al and Ga can be varied.

When the semiconductor lamination portion comprises a light emitting layer forming portion and a current dispersion layer, Vickers' hardness of the current dispersion layer may be 700 or higher. Further, when the semiconductor lamination portion comprises the light emitting layer forming portion, the current dispersion layer and a protecting layer made of AlGaAs based compound semiconductor, Vickers' hardness of the protecting layer may be 700 or higher.

A contact layer may be interposed between the current dispersion layer and the one electrode.

If a carrier concentration of the current dispersion layer is $1 \times 10^{18}$ to $5 \times 10^{19}$ cm$^{-3}$, current dispersion effect is enhanced.

It is preferable that the light emitting layer forming portion and the current dispersion layer are laminated by MOCVD method, and the current dispersion layer and/or the protecting layer is allowed to grow at a temperature higher than that of the light emitting layer forming portion, because it is easy to form the semiconductor layer with the above-described hardness at high carrier concentration.

If the semiconductor substrate is formed into n-type and the current dispersion layer is formed into p-type,and a dopant of the current dispersion layer is Zn it is easy to obtain high carrier concentration and to increase the hardness.

For example, the current dispersion layer comprises $Al_yGa_{1-y}As$ ($0.5 \leq y \leq 0.8$), and the protecting layer comprises $Al_zGa_{1-z}As$ ($0.3 \leq z \leq 0.6$).

DETAILED DESCRIPTION

Figure 1:
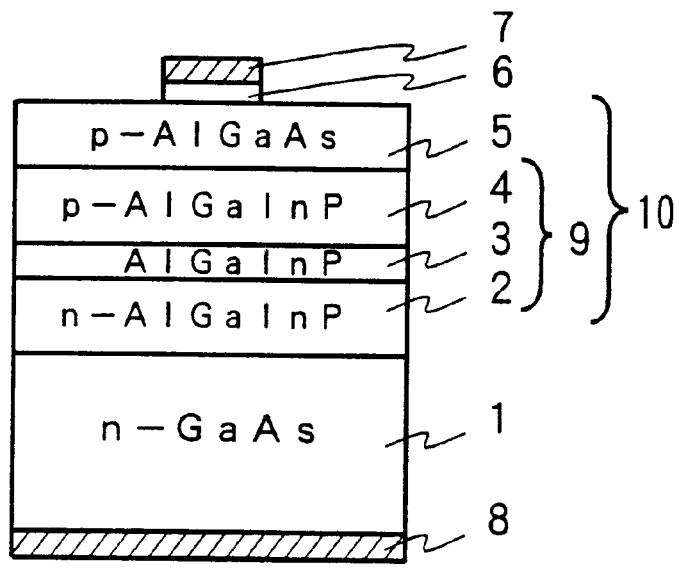
FIG. 1 is a diagram showing a cross section of a semiconductor light emitting device of an embodiment of the present invention.

FIG. 1 shows a cross section of one example of a semiconductor light emitting device of the present invention. As shown in FIG. 1, in the semiconductor light emitting device of the present invention comprises a light emitting layer forming portion 9 made of InGaAlP based compound semiconductor for forming a light emitting layer is deposited on an n-type GaAs substrate 1, a p-type current dispersion layer 5 made of AlGaAs based compound semiconductor is provided on a surface of the light emitting layer forming portion 9, and a semiconductor lamination portion 10 is formed. A p-side electrode 7 is provided on a portion of a surface of the semiconductor lamination portion 10 through a contact layer 6 made of p-type GaAs, and an n-side electrode 8 is provided on a back surface of the GaAs substrate 1. The present invention is characterized in that a semiconductor layer exposing at least the outermost surface of the semiconductor lamination portion 10, for example, the current dispersion layer 5 made of AlGaAs based compound semiconductor (AlGaAs, hereinafter) is formed as hard as Vickers' hardness of 700 or higher.

Figure 2:
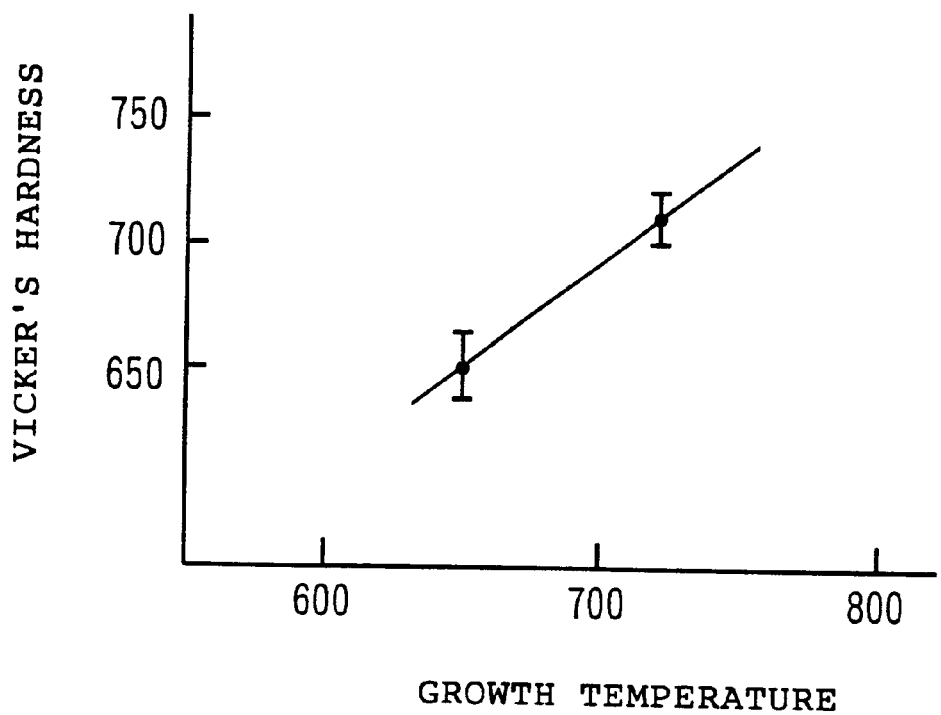
FIG. 2 is a view showing the relation between a growth temperature when an AlGaAs layer grows and a hardness of the AlGaAs layer.

The current dispersion layer 5 is provided for spreading current from the p-side electrode 7 over the entire chip, which is provided on the portion of the surface of the laminated semiconductor layer. A carrier concentration of the current dispersion layer 5 is about $1 \times 10^{18}$ to $5 \times 10^{19}$ cm$^{-3}$ and a thickness thereof is about 1 to 10 μm. Further, in order to increase band gap so as not to absorb light irradiated toward a surface of the current dispersion layer 5, $Al_y Ga_{1-y}As$ ($0.5 \leq y \leq 0.8$) having a mixed crystal ratio y of Al of 0.5 or more is used for the current dispersion layer 5. In order to allow the current dispersion layer 5 made of AlGaAs to disperse the current easier, it is necessary to increase its carrier concentration. So, conventionally, the layer was allow to grow in a state where temperature of the substrate is as low as about 650° C. so that a p-type dopant such as Zn can easily be doped. However, as a result of earnest study by the present inventors as described above, it was found that a hardness of an AlGaAs layer was varied depending upon a temperature at the time of growth (growth temperature, hereinafter), and the relation as shown in FIG. 2 was obtained between a growth temperature and a hardness when growing a layer by MOCVD method, and by growing the current dispersion layer 5 at a temperature of 700° C. or higher, more preferably, at 710 to 720° C., Vickers' hardness of 700 or higher could be obtained, and even at the time of handling for assembling, a strong LED chip was much less prone to cause a fracture or a crack.

The light emitting layer forming portion 9 is made of AlGaInP based compound semiconductor, and comprises an, n-type clad layer 2 having carrier concentration of about $1 \times 10^{17}$ to $1 \times 10^{19}$ cm$^{-3}$ and a thickness of about 0.1 to 2 μm; an active layer 3 made of InGaAlP based compound semiconductor having such a composition that a band gap energy thereof is smaller than that of the clad layer at non-doped and having a thickness of about 0.1 to 2 μm; and a p-type clad layer 4 made of InGaAlP based compound semiconductor which is the same as that of the n-type clad layer 2. The light emitting layer forming portion 9 may be deposited on the GaAs substrate 1 through a buffer layer which is not shown in some cased. In such a case, the buffer layer is made of n-type GaAs, a thickness thereof is about 0.1 to 2 μm, and its carrier concentration is about $1 \times 10^{17}$ to $1 \times 10^{19}$ cm$^{-3}$.

A p-side electrode 7 made of Au-Ti alloy or Au—Zn—Ni alloy is provided on a portion of a surface of the current dispersion layer 5 (surface of the semiconductor lamination portion 10) through a contact layer made of p-type GaAs, and an n-side electrode 8 made of Au—Ge—Ni alloy is provided on a back surface of the GaAs substrate 1. The contact layer 6 may not be provided in some cases.

To produce such an LED chip, an n-type, for example, GaAs substrate 1 is provided into an MOCVD (metal-organic chemical vapor deposition). apparatus, trimethyl gallium (TMG, hereinafter) and arsine (AsH$_3$, hereinafter) which are reaction gas, and H$_2$Se which is an n-type dopant gas are introduced together with hydrogen of carrier gas, they are allow to epitaxially grow at about 500 to 700° C., and about 0.1 μm of the buffer layer (not shown) made of n-type GaAs which is doped with Se such that its carrier concentration reaches about $1 \times 10^{18}$ cm$^{-3}$ is formed. Then, instead of AsH$_3$, phosphine (PH$_3$, hereinafter), trimethyl aluminum (TMA, thereinafter), and trimethyl indium (TMIn, hereinafter) are introduced, and about 0.5 μm of the n-type clad layer made of $In_{0.49}(Ga_{0.3}Al_{0.7})_{0.51}P$ having carrier concentration of about $1 \times 10^{17}$ to $1 \times 10^{19}$ cm$^{-3}$ is epitaxially grown. Then, TMA which is reaction gas is reduced, TMG is increased, and about 0.5 μm of the active layer 3 made of non-doped $In_{0.49}(Ga_{0.75}Al_{0.25})_{0.51}P$ is epitaxially grown. Then, with the same reaction gas as that of the n-type clad layer 2, dimethyl zinc (DMZn) is introduced as Zn-dopant gas instead of H$_2$Se, and about 0.5 μm of the p-type clad layer 4 made of $In_{0.49}(Ga_{0.3}Al_{0.7})_{0.51}$ having carrier concentration of $1 \times 10^{16}$ to $1 \times 10^{19}$ cm$^{-3}$ is epitaxially grown.

The growth temperature is further increased up to about 720° C., and while DMZn dopant gas is introduced, TMA, TMG and AsH$_3$ are uses as reaction gas, growth of AlGaAs is continued, about 1 to 10 μm of the current dispersion layer 5 having carrier concentration of about $1 \times 10^{18}$ to $1 \times 10^{19}$ cm$^{-3}$ is formed, the growth temperature is decreased down to 700° C., TMA reaction gas is stopped, and about 0.2 to 1 μm of the contact layer 6 made of GaAs is grown. In this case, since the growth temperature is high, the p-type dopant is not doped sufficiently, but by increasing the flow rate of the p-type dopant gas by about 100%, the above-described desired carrier concentration can be obtained.

Then, a wafer is brought into a vacuum evaporator, a film of Au-Ti alloy or Au—Ge—Ni alloy is formed on a surface of the contact layer 6 by vacuum evaporation or the like, the alloy film and the contact layer 6 are subjected to the patterning as shown in FIG. 1 to form the p-side electrode 7, a film of Au—Ge—Ni alloy or the like is formed on the entire back surface of the GaAs substrate 1 to form the n-side electrode 8, and it is subjected to dicing to chip the wafer.

Figure 3:
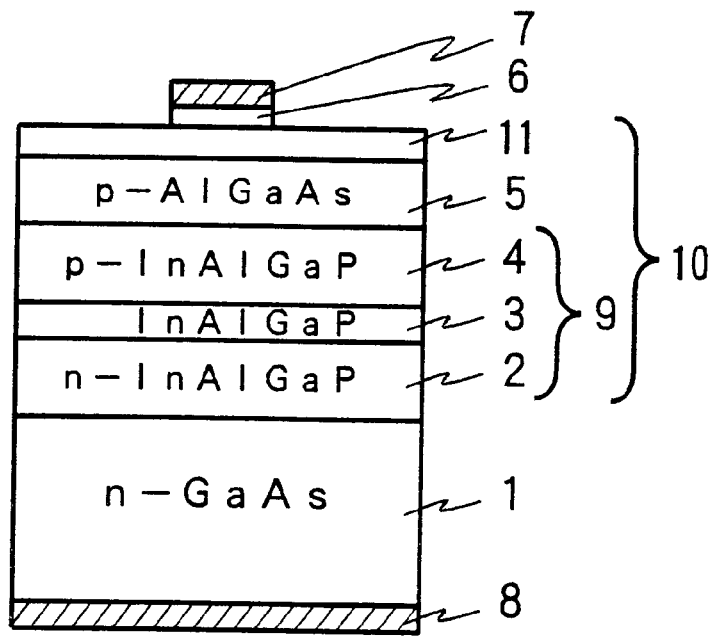
FIG. 3 is a diagram showing a cross section of a semiconductor light emitting device of another embodiment of the present invention.
Figure 4:
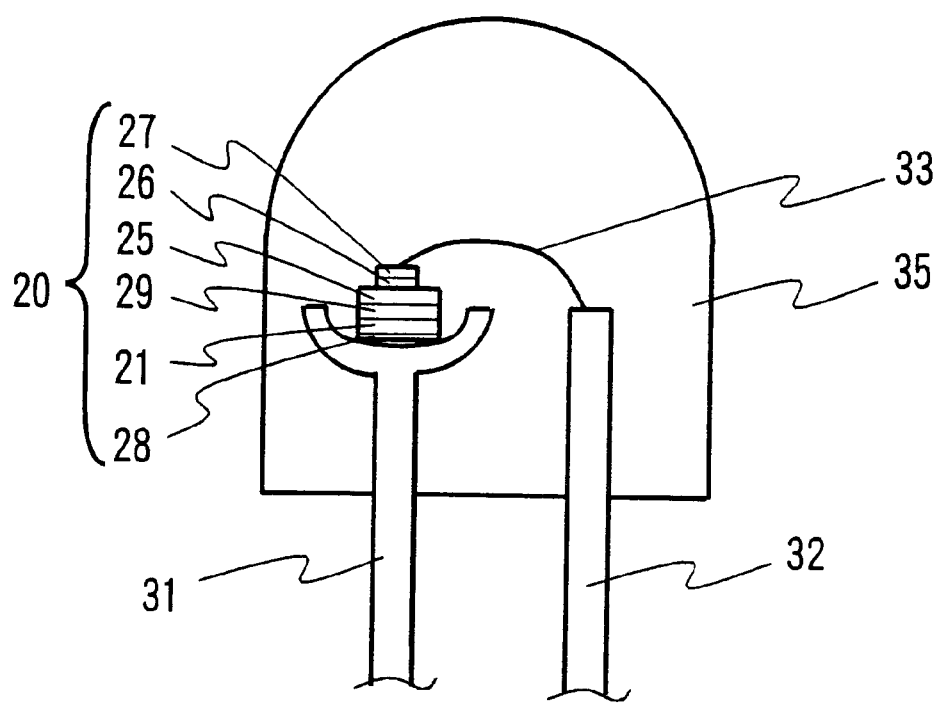
FIG. 4 is a schematic sectional view of a conventional visible radiation lamp-type semiconductor light emitting device.

In the above example, the semiconductor lamination portion 10 comprises the light emitting layer forming portion 9 and the current dispersion layer 5. Even when another semiconductor layer such as a protecting layer, which is the outermost surface layer of the semiconductor lamination portion 10, is provided on the current dispersion layer, it is possible to make the wafer less prone to produce a fracture or a crack by forming the outermost layer as hard as Vickers' hardness of 700 or higher. That is, the current dispersion layer 5 has high mixed crystal ratio of Al so as to increase the band gap as described above, but if the mixed crystal ratio of Al is high, it is prone to be subject to corrosion. Therefore, as shown in FIG. 3, about 0.01 to 1 μm of protecting layer 11 comprising $Al_zGa_{1-z}As$ ($0.3 \leq z \leq 0.6$) having small mixed crystal ratio of Al is provided on a surface of the current dispersion layer 5 in some cases. In such a case, it is preferable that the hardness of the protecting layer 11 or the hardness of both the protecting layer 11 and the current dispersion layer 5 is set in the above-described range. In FIG. 3, the structure except the protecting layer 11 is the same as that shown in FIG. 1, the same portions are designated with the same reference numbers, and explanation thereof is omitted.

Conventionally, the AlGaAs layer which is the current dispersion layer 5 is allowed to grow at a temperature lower than the growth temperature of the light emitting layer forming portion 9 made of InGaAlP based compound semiconductor. However, according to the present invention, the AlGaAs layer is allowed to grow at about 720° C. which is higher than the growth temperature of the light emitting layer forming portion 9, and the hardness thereof is set to Vickers' hardness of 700 or higher. A force applied to the LED chip is applied mainly to a surface of the LED chip, and the force does not affect a hardness of interior thereof so much. Therefore, if the AlGaAs layer which is exposed at the surface is formed hard, brittleness is eliminated against a force from outside, at the time of chipping from a wafer, or at the time of handling for mounting the LED chip or wire bonding, the structure is extremely stable, and incidence of failure of LED chips at the time of assembling is largely reduced.

The above-described example employs the double hetero junction structure in which the active layer 3 is sandwiched between both the clad layers 2 and 4, in which materials, e.g., the different mixed crystal ratio of Al are employed as the active layer 3 and both the clad layer 2 and 4, and the active layer 3 as the light emitting layer is formed such as to easily enclose carrier and light. Instead of this structure, a p-n junction may be formed without through the active layer 2, and the light emitting layer may be formed on the p-n junction portion.

Although the concrete material is used as each of semiconductor layers forming the semiconductor light emitting devices, and thickness or carrier concentration thereof are specified in the above example, the present invention should not be limited to these examples.

According to the present invention, since the surface of the semiconductor lamination portion of the LED chip is hard, it is possible to largely reduce assembling failure such as fracture or crack when a wafer is chipped or at the time of die bonding or handling therefor, or handling such as wire bonding, and it is very easy to handle, and the time of assembling is reduced. As a result, the present invention contributes to reduction in cost of the semiconductor light emitting device.

Although preferred example have been described in some detail it is to be understood that certain changes can be made by those skilled in the art without departing from the spirit and scope of the invention as defined by the appended claims.

What is claimed is:

1. A semiconductor light emitting device comprising:

a semiconductor substrate;

a semiconductor lamination portion including multiple semiconductor layers having a light emitting layer forming portion made of InGaAlP based compound semiconductor and a current dispersion layer made of AlGaAs based compound semiconductor positioned above said light emitting layer forming portion; and two electrodes, one of them being provided on a portion of a surface of said semiconductor lamination portion and the other one being provided at a back surface of said semiconductor substrate;

wherein Vickers' hardness of at least an outermost layer of said multiple semiconductor layers of said semiconductor lamination portion is 700 or higher.

2. A semiconductor light emitting device according to claim 1, wherein Vickers' hardness of said current dispersion layer is 700 or higher.

3. A semiconductor light emitting device according to claim 2, wherein a contact layer is interposed between said current dispersion layer and said one electrode.

4. A semiconductor light emitting device according to claim 2, wherein a carrier concentration of said current dispersion layer is as high as $1 \times 10^{18}$ to $5 \times 10^{19}$ $cm^{-3}$.

5. A semiconductor light emitting device according to claim 4, wherein said light emitting layer forming portion and said current dispersion layer are laminated by MOCVD method, and said current dispersion layer is allowed to grow at a temperature higher than that of said light emitting layer forming portion.

6. A semiconductor light emitting device according to claim 4, wherein said semiconductor substrate is formed into n-type, said current dispersion layer is formed into p-type, and a dopant of said current dispersion layer is Zn.

7. A semiconductor light emitting device according to claim 1, wherein said semiconductor lamination portion comprises said light emitting layer forming portion, said current dispersion layer and a protecting layer made of AlGaAs based compound semiconductor in this order, and Vickers' hardness of said protecting layer is 700 or higher.

8. A semiconductor light emitting device according to claim 7, wherein a contact layer is interposed between said protecting layer and said one electrode.

9. A semiconductor light emitting device according to claim 7, wherein said current dispersion layer comprises $Al_yGa_{1-y}As$ ($0.5 \leq y \leq 0.8$), and said protecting layer comprises $Al_zGa_{1-z}As$ ($0.3 \leq z \leq 0.6$).

\* \* \* \* \*